(12) United States Patent
Grover et al.

(10) Patent No.: US 11,605,424 B2
(45) Date of Patent: *Mar. 14, 2023

(54) IN-MEMORY COMPUTE ARRAY WITH INTEGRATED BIAS ELEMENTS

(71) Applicant: STMICROELECTRONICS INTERNATIONAL N.V., Geneva (CH)

(72) Inventors: Anuj Grover, New Delhi (IN); Tanmoy Roy, Greater Noida (IN); Nitin Chawla, New Delhi (IN)

(73) Assignee: STMicroelectronics International N.V., Geneva (CH)

(*) Notice: Subject to any disclaimer, the term of this patent is extended or adjusted under 35 U.S.C. 154(b) by 0 days.

This patent is subject to a terminal disclaimer.

(21) Appl. No.: 17/375,945

(22) Filed: Jul. 14, 2021

(65) Prior Publication Data
US 2021/0343334 A1 Nov. 4, 2021

Related U.S. Application Data

(63) Continuation of application No. 16/882,024, filed on May 22, 2020, now Pat. No. 11,094,376.
(Continued)

(51) Int. Cl.
*G11C 11/41* (2006.01)
*G11C 11/419* (2006.01)
*H01L 27/11* (2006.01)

(52) U.S. Cl.
CPC ........ *G11C 11/419* (2013.01); *H01L 27/1104* (2013.01)

(58) Field of Classification Search
None
See application file for complete search history.

(56) References Cited

U.S. PATENT DOCUMENTS

| 8,238,173 B2 | 8/2012 | Akerib et al. |
| 9,418,719 B2 | 8/2016 | Akerib et al. |

(Continued)

OTHER PUBLICATIONS

Jaiswal, "8T SRAM Cell as a Multi-bit Dot Product Engine for Beyond von-Neumann Computing," arXiv:1802.08601v2, 2018, 10 pages.

(Continued)

*Primary Examiner* — Tan T. Nguyen
(74) *Attorney, Agent, or Firm* — Seed Intellectual Property Law Group LLP

(57) ABSTRACT

An in-memory compute (IMC) device includes a compute array having a first plurality of cells. The compute array is arranged as a plurality of rows of cells intersecting a plurality of columns of cells. Each cell of the first plurality of cells is identifiable by its corresponding row and column. The IMC device also includes a plurality of computation engines and a plurality of bias engines. Each computation engine is respectively formed in a different one of a second plurality of cells, wherein the second plurality of cells is formed from cells of the first plurality. Each computation engine is formed at a respective row and column intersection. Each bias engine of the plurality of bias engines is arranged to computationally combine an output from at least one of the plurality of computation engines with a respective bias value.

20 Claims, 7 Drawing Sheets

Related U.S. Application Data

(60) Provisional application No. 62/858,265, filed on Jun. 6, 2019.

(56) References Cited

U.S. PATENT DOCUMENTS

| | | | |
|---|---|---|---|
| 10,073,733 B1 | 9/2018 | Jain et al. | |
| 10,109,348 B2 | 10/2018 | Hu et al. | |
| 10,733,498 B1* | 8/2020 | Diamant | G06V 30/19173 |
| 11,094,376 B2* | 8/2021 | Grover | H01L 27/1104 |
| 2015/0131383 A1 | 5/2015 | Akerib et al. | |
| 2015/0363667 A1 | 12/2015 | Nakai et al. | |
| 2018/0075904 A1 | 3/2018 | Ge et al. | |
| 2019/0164037 A1 | 5/2019 | Kim et al. | |
| 2021/0048991 A1* | 2/2021 | Tanner | G06F 17/153 |

OTHER PUBLICATIONS

Mittal, "A Survey of ReRAM-Based Architectures for Processing-In-Memory and Neural Networks," *Mach. Learn. Knowl. Extr.1*:75-114, 2019.

Song et al., "PipeLayer: A Pipelined ReRAM-Based Accelerator for Deep Learning," IEEE International Symposium on High Performance Computer Architecture (HPCA), Feb. 4-8, 2017, Austin, Texas, 13 pages.

* cited by examiner

*132*

| | F1[a1] | F1[b1] | F1[..1] | F2[a1] | F2[b1] | | Fx[..1] |
|---|---|---|---|---|---|---|---|
| 180 | F1[a1] | F1[b1] | F1[..1] | F2[a1] | F2[b1] | | Fx[..1] |
| | F1[a2] | F1[b2] | F1[..2] | F2[a2] | F2[b2] | | Fx[..2] |
| | F1[a3] | | | F2[a3] | F2[b3] | | |
| | | | | | F2[b4] | | |
| | ⋮ | ⋮ | ⋮ | ⋮ | ⋮ | | ⋮ |
| | | | | | F2[bn-1] | | |
| 182 | F1[an] | F1[bn] | F1[..n] | F2[an] | F2[bn] | | Fx[..n] |
| 184 | B1[1] | B1[m] | | B2[1] | B2[m] | | Bx[..m] |
| | B1[2] | B1[m+1] | | B2[2] | B2[m+1] | | Bx[m+1] |
| | ⋮ | ⋮ | | ⋮ | ⋮ | | ⋮ |
| 186 | B1[k] | | | B2[k] | | | Bx[..k] |

Columns: 170, 172, 174, 176, 178

Fig. 6

IN-MEMORY COMPUTE ARRAY WITH INTEGRATED BIAS ELEMENTS

BACKGROUND

Technical Field

The present disclosure generally relates to a memory array having in-memory compute capability. More particularly, but not exclusively, the present disclosure relates to an in-memory compute array having integrated bias elements.

Description of the Related Art

It is known that various computer vision, speech recognition, and signal processing applications benefit from the use of learning machines. Learning machines, as discussed in this disclosure, may fall under the technological titles of machine learning, artificial intelligence, neural networks, probabilistic inference engines, accelerators, and the like. Such machines are arranged to quickly perform hundreds, thousands, and millions of concurrent operations. Conventional learning machines can deliver hundreds of teraflops (i.e., one million millions (—12) floating-point operations per second) of computing power.

In some cases, learning machines are organized having one or more arrays of volatile memory cells that are capable of performing "in-memory computing" functions. The in-memory computing functions address one data throughput bottleneck by performing at least some computations (e.g., gating operations (e.g., AND, NAND, OR, NOR, and the like), adder functions, shift operations, and the like) as a single operation that occurs within the memory rather than a conventional operation that retrieves data from memory array, performs the desired action with conventional process circuitry, and saves the result back into the memory.

Some aspects of technologies and related art that may be useful in understanding the present invention are described in the following publications:

U.S. Pat. No. 10,073,733 to Jain et al., which describes a system and method for in-memory computing;

U.S. Pat. No. 9,418,719 to Akerib et al., which describes an in-memory computational device;

U.S. Pat. No. 8,238,173 to Akerib et al., which describes use of storage cells to perform computation; and U.S. Patent Publication No. 2015/0131383 A1 of Mikamonu Group Ltd. et al., which describes a non-volatile in-memory computing device.

FIG. 1 is a conventional static random access memory (SRAM) cell 10 (i.e., a memory bitcell). The memory cell 10 is formed as a six transistor (6T) memory cell. Other memory cell architectures having a different number of transistors (e.g., 1T, 4T, 8T, 10T, and the like) are used in other memory cells. In addition, the transistors in memory cell 10 are formed as metal oxide semiconductor field effect transistors (MOSFETs), but other architectures are used in other types of memory cells. These other architectures are not described in the present disclosure for brevity.

Memory cell 10 stores a single bit of data in a bitcell 12. The bitcell 12 includes four transistors T3, T4, T5, T6. The four transistors are electrically arranged as two cross-coupled inverters. As so arranged, the cell 10 will reliably store a logic zero (i.e., "0") bit or a logic one (i.e., "1") bit.

Access to the bitcell 12 is granted first via a word line 14 signal. When the word line 14 is asserted, access transistors T1, T2 couple the bitcell 12 between differential bit lines 16A, 16B via respective data access lines 18A, 18B.

To read a bit stored in the bitcell 12, the differential bit lines 16A, 16B are pre-charged to a high (i.e., "1") logic state, and the access transistors T1, T2 are enabled (i.e., turned on) via a signal asserted on word line 14. Depending on whether bitcell 12 is storing a logic one (i.e., "1") or a logic zero (i.e., "0"), voltage on one bit line 16A, 16B or the other will slightly drop. This voltage differential is passed from the bitcell 12 via data access lines 18A, 18B to respective bit lines 16A, 16B, and detected by a sensing element (e.g., a sense amplifier, an analog-to-digital converter, or the like) (not shown) coupled between the bit lines 16A, 16B.

To write a bit to the bitcell 12, the desired logic one (i.e., "1") or logic zero (i.e., "0") is applied to bit line 16B (e.g., BL in FIG. 1), and the opposite logic value is applied to bit line 16A (e.g., not BL in FIG. 1). After the signals are asserted on bit lines 16A, 16B, the word line 14 is asserted, which will enable the access transistors T1, T2, and thereby apply the differential voltage across the data access lines 18A, 18B to the bitcell 12. The new or same value will be driven into the cross-coupled inverters and latched into the bitcell 12.

To maintain the data bit in the bitcell 12, the word line signal 14 is removed, which de-couples the bitcell 12 from the bit lines 16A, 16B. A voltage maintained between bitcell voltage source 20 and ground plane 22 will keep the cross-coupled inverters in a state of stability, which will maintain the data bit.

Conventionally, the memory cell 10 of FIG. 1 will be one of many hundreds, thousands, or millions of identical cells arranged in one or more array structures in an SRAM memory device. These types of SRAM memory devices are in some cases modified and used in learning machines such as computer vision devices, speech recognition systems, signal processing applications, and any other such learning machines. To increase processing, the SRAM memory cells of FIG. 1 may be organized in devices that also include computational abilities.

FIG. 2 is a conventional in-memory computing system 30. The in-memory computing system 30 is arranged to perform particular computing operations within the memory array 32. The operations may, for example, include gating operations (e.g., AND, NAND, OR, NOR, and the like), adder functions, shift operations, and the like.

To utilize the conventional in-memory computing system 30, an address 34 is programmatically applied to an address decoder 36. Along the lines of bitcell 12 of FIG. 1, the address decoder 36 generates appropriate word line (WL) and bit line (BL) signals along with read and write signals (not shown), which are applied to the memory array 32. The memory array 32, as indicated by a plurality of word lines WL and a plurality of bit lines, BL_A, BL_B, BL_N, may be of any desirable size.

In correspondence with address information 34 reaching the address decoder 36, one or more in-memory compute instructions 38 are programmatically applied to an in-memory compute decoder 40. The in-memory compute instructions 38 may be passed from a processor of a learning machine or some other type of processor. The in-memory compute instructions 38 are in some cases formed as a coded selection of a desired in-memory computation.

The in-memory compute decoder 40 will interpret the in-memory compute instructions 38 and generate appropriate in-memory control signaling 42 that is passed to an in-memory compute code generator 44. In one case, for example, the in-memory control signaling 42 is arranged as a three-line signal, and the three lines are decoded by the in-memory compute code generator 44 into eight distinct in-memory computational directives, which are passed to respective sensing element circuits 46_A, 46_B, 46_N. Sensing element circuits 46_A, 46_B, 46_N, which differentially read information from bit lines, are known in the art and not further described.

As illustrated in FIG. 2, the in-memory compute decoder 40 and the in-memory compute code generator 44 respectively pass in-memory compute selection signals 50 and in-memory compute directive signals 52 to the sensing element circuits 46_A, 46_B, 46_N. The in-memory compute selection signals 50 are arranged to direct sensing element circuits 46_A, 46_B, 46_N to the appropriate circuitry that will perform the selected computation, and the in-memory compute directive signals 52 control the computation and further direct the sensing element circuits 46_A, 46_B, 46_N to apply signaling to the bit lines to store the computational results back into the memory array 32.

A set of bias circuits 48_A, 48_B, 48_N are also coupled to the bit lines of the memory array 32. It is known, particularly in learning machines, that application of a suitable bias voltage may improve accuracy of the learning machine results. In the conventional in-memory computing system 30, after an entire in-memory computation across all of the cells in a pair of bit lines has been performed, the bias voltage is applied to the respective bit line.

FIG. 3 is a portion of the conventional in-memory computing system 30A of FIG. 2 in more detail. In the portion 30A, an entire column of bitcells 12A-12N is represented between a pair of differential bit lines in a memory array 32A. Each bit cell 12A-12N may be along the lines of bitcell 12 in FIG. 1. The entire line may include 8 bitcells, 128 bit cells, 1024 bitcells, 8192 bitcells, or some other number of bitcells. The in-memory compute functions of FIG. 2 are not repeated for brevity. To avoid obfuscating the figure, access transistors are represented in FIG. 3 but not individually labelled except by a word line reference indicator.

Data collected by sensing element circuitry 46 may further be digitized by analog to digital control (ADC) circuitry and provided to an adder circuit 56. Additionally, a bias control circuit 48 directs one or more digital bit values (e.g., a digital bit stream of data) from a bias value repository 54 also be supplied to the adder circuit 56. The selected bias data from the bias value repository 54 and the determined computational data from the sensing element circuitry 46 are combined and passed to consolidation circuitry 58. The consolidation circuitry 58 may include any one or more of an accumulator, sensing element, analog-to-digital converter, clock circuit, serial-to-parallel converter, latch, or the like. The output value data, which may be single bits of data, a stream of data bits, or data in some other form, is communicated back through the sensing element circuitry 46 to be returned to the respectively selected bitcell or bitcells. The output value data may optionally be returned from the in-memory computing system 30A to a processor that is coupled to the memory via an output conduit 60.

All of the subject matter discussed in the Background section is not necessarily prior art and should not be assumed to be prior art merely as a result of its discussion in the Background section. Along these lines, any recognition of problems in the prior art discussed in the Background section or associated with such subject matter should not be treated as prior art unless expressly stated to be prior art. Instead, the discussion of any subject matter in the Background section should be treated as part of the inventor's approach to the particular problem, which, in and of itself, may also be inventive.

BRIEF SUMMARY

The use of conventional in-memory computation structures and methodologies provides benefits, particularly to learning machine systems, but the conventional systems are lacking. The conventional systems impose bias values only after an entire computation has been performed. It has been recognized by the inventors that in order to add bias without a loss of accuracy, computations can, at least in some cases, be performed partially, and bias should be imposed on the partial result. If the conventional in-memory computation structures are used to maintain this type of accuracy, then the conventional in-memory computation structures are forced to perform complete computations as a sequence of partial transactions, which takes additional time and expends additional energy. Accordingly, one practical application of the inventive subject matter disclosed herein includes storing bias data values in a plurality of rows and columns of a memory array to be applied contemporaneously with the in-memory computation functions. This organization leads to improved accuracy, reduced power, and higher accuracy over the conventional systems.

An in-memory compute (IMC) device may be summarized as including: a compute array having a first plurality of cells, the compute array arranged as a plurality of rows of cells intersecting a plurality of columns of cells, each cell of the first plurality of cells identifiable by its corresponding row and column; a plurality of computation engines, each computation engine respectively formed in a different one of a second plurality of cells, the second plurality of cells being formed from cells of the first plurality of cells, each computation engine formed at a respective row and column intersection; and a plurality of bias engines, each bias engine of the plurality of bias engines arranged to computationally combine an output from at least one of the plurality of computation engines with a respective bias value.

A portion of the first plurality of cells may be arranged as an array of memory bitcells. The array of memory bitcells may be formed as a static random access memory (SRAM) memory array. At least some of the plurality of computation engines may be arranged to perform at least one gating operation. At least some of the plurality of computation engines may be arranged to perform at least one mathematical operation. The plurality of bias engines may be arranged as an array. The plurality of bias engines arranged as the array may be formed in adjacent cells of the first plurality of cells. Each bias engine of the plurality of bias engines may be arranged as a memory bitcell.

The IMC device may further include consolidation circuitry coupled to each of the plurality of columns of cells, the consolidation circuitry arranged to form at least one output value generated from data in one or more of a computation engine and a bias engine.

The consolidation circuitry may include at least one sensing element.

An in-memory compute (IMC) method may be summarized as including: storing a plurality of neural network kernel or feature values in a respective plurality of memory bitcells of an in-memory compute memory device, wherein the in-memory compute memory device is organized having a first plurality of cells arranged as a plurality of rows of cells intersecting a plurality of columns of cells, each cell of the first plurality of cells identifiable by its corresponding row and column; performing a plurality of in-memory functions wherein at least some in-memory functions of the plurality of in-memory functions take ones of the plurality of neural network kernel or feature values as operands; storing results of the plurality of in-memory functions in a respective second plurality of cells, the second plurality of cells being formed from cells of the first plurality of cells; and computationally combining the results of the plurality of in-memory functions with a respective plurality of bias values.

A portion of the in-memory compute memory device may be a static random access memory (SRAM) memory device. The plurality of in-memory functions may include at least one gating function or at least one mathematical function. Computationally combining the results of the plurality of in-memory functions with the respective plurality of bias values may include combining a row of results information with a row of bias values. Computationally combining the results of the plurality of in-memory functions with the respective plurality of bias values may include: producing a set of computationally combined values; and storing the set of computationally combined values in memory bitcells of the first plurality of cells without passing the set of computationally combined values out of the in-memory compute memory device. Computationally combining the results of the plurality of in-memory functions with the respective plurality of bias values may include: producing a set of computationally combined values; storing the set of computationally combined values in memory bitcells of the first plurality of cells; and passing at least some of the set of computationally combined values out of the in-memory compute memory device.

A system may be summarized as including: an in-memory compute memory device having arranged therein: an array of cells, the array of cells addressable via selected ones of a plurality of rows of cells that intersect a plurality of columns of cells, wherein each cell of the array of cells is identifiable by its corresponding row and column; a plurality of computation engines formed at selected row and column intersections; and a plurality of bias engines arranged to computationally combine an output from at least one of the plurality of computation engines with a respective bias value; functional logic; and a processor coupled to the in-memory compute memory device and the functional logic, wherein the processor is arranged to perform functions of a learning machine, the functions of the learning machine including: storing a plurality of neural network kernel or feature values in a respective first plurality of memory bitcells of the in-memory compute memory device; receiving streaming data from the functional logic; performing a plurality of in-memory functions using at least some of the plurality of computation engines, wherein at least some in-memory functions of the plurality of in-memory functions take ones of the plurality of neural network kernel or feature values as first operand data and at least some of the streaming data as second operand data; storing results of the plurality of in-memory functions in a respective second plurality of memory bitcells of the in-memory compute memory device; and computationally combining the results of the plurality of in-memory functions with a respective plurality of bias values.

The in-memory compute memory device, the functional logic, and the processor may be arranged as an Internet of Things (IoT) device, an industrial device, or a vehicle-based device. The functions of the learning machine may include: a first level of learning machine functions that produce a first result; and a second level of learning machine functions that produce a second result, wherein the first level of learning machine functions are performed first, and wherein the second level of learning machine functions are selectively performed based on the first result. The first level of learning machine functions may operate at a first power level, and the second level of learning machine functions may operate at a second power level that is different from the first power level.

These features, along with other objects and advantages that will become subsequently apparent, reside in the details of construction and operation more fully described hereafter and claimed, reference being made to the accompanying drawings that form a part hereof.

This Brief Summary has been provided to introduce certain concepts in a simplified form that are further described in detail below in the Detailed Description. Except where otherwise expressly stated, the Brief Summary does not identify key or essential features of the claimed subject matter, nor is it intended to limit the scope of the claimed subject matter.

BRIEF DESCRIPTION OF THE SEVERAL VIEWS OF THE DRAWINGS

Non-limiting and non-exhaustive embodiments are described with reference to the following drawings, wherein like labels refer to like parts throughout the various views unless otherwise specified. The sizes and relative positions of elements in the drawings are not necessarily drawn to scale. For example, the shapes of various elements are selected, enlarged, and positioned to improve drawing legibility. The particular shapes of the elements as drawn have been selected for ease of recognition in the drawings. One or more embodiments are described hereinafter with reference to the accompanying drawings in which:

FIG. 6 is a memory array embodiment that illustrates in-memory computing functions and a plurality of bias elements.

DETAILED DESCRIPTION

Figure 1:
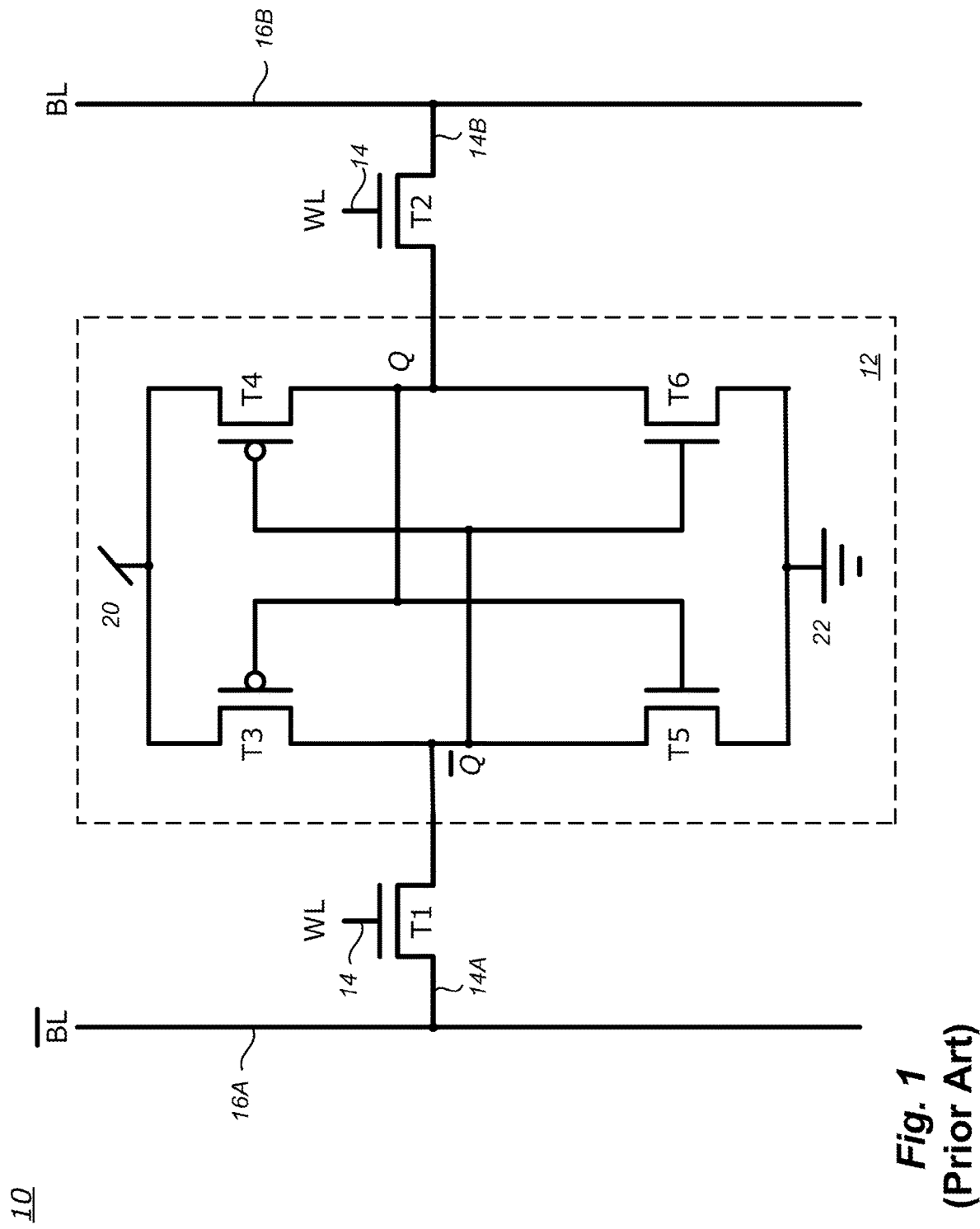
FIG. 1 is a conventional static random access memory (SRAM) cell.

The present invention may be understood more readily by reference to this detailed description of the invention. The terminology used herein is for the purpose of describing specific embodiments only and is not limiting to the claims unless a court or accepted body of competent jurisdiction determines that such terminology is limiting. Unless specifically defined herein, the terminology used herein is to be given its traditional meaning as known in the relevant art.

In the following description, certain specific details are set forth in order to provide a thorough understanding of various disclosed embodiments. However, one skilled in the relevant art will recognize that embodiments may be practiced without one or more of these specific details, or with other methods, components, materials, etc. In other instances, well-known structures associated with electronic circuitry, computing systems including client and server computing systems, networks, and other related technologies have not been shown or described in detail to avoid unnecessarily obscuring descriptions of the embodiments presented herein.

In-memory computation structures and methodologies can improve conventional computing systems and provide several benefits. These structures and methodologies can provide benefits to learning machine systems in particular, but the systems, devices, and methods (i.e., the teaching) of the present disclosure are not limited to learning machines. Learning machines, as discussed in this disclosure, may fall under the technological titles of machine learning, artificial intelligence, neural networks, probabilistic inference engines, accelerators, and the like. Computing systems that are not expressly identified as learning machines may fall under the technological titles of Von Neumann architecture computers, Harvard architecture computers, calculating machines, processors, microcontrollers, microprocessors, programmable computers, traditional computers, and the like. The teaching of the present disclosure may be integrated with, or otherwise applied to, both learning machines and non-learning machines. For the sake of brevity, but not limitation, the present disclosure generally describes embodiments directed toward learning machines.

As discussed herein, in-memory computing systems are improved when a bias architecture is moved from outside of the memory array to inside of the memory array. When the bias architecture is outside of the memory array, bias values can only be imposed after an entire computation has been performed. While it is possible in conventional in-memory computing systems to perform a full computation as a set of partial computations, and to apply bias after each partial computation, this type of system is slower and less efficient than desired.

The inventors have recognized that adding bias to partial computations within the memory cell architecture will improve throughput of the system, maintain accuracy, and reduce power consumption.

In at least one embodiment, a software practitioner is designing a practical application for a learning machine. The learning machine may be, or otherwise include, a convolutional neural network, a machine vision system, or some other type of artificial intelligence computational device. The software practitioner may recognize that the learning machine will perform thousands, millions, or more concurrent computational functions, and the machine will benefit from performing many of these concurrent computational functions using an in-memory computing architecture. The software practitioner may further recognize that in order to improve or otherwise maintain accuracy, a particular bias should be applied during the performance of the in-memory computational functions. To implement these features, the software practitioner will format his learning machine system to include one or more of the devices, methods, and system embodiments described in the present disclosure (i.e., the teachings of this disclosure) that enable in-memory computational functions with integrated bias elements.

In at least one case, the software practitioner is implementing an edge computing system to control a security camera. Such an implementation may be deployed remotely and it is desired that the device consume very low power. The remote security camera may be powered by a battery or other power storage device of limited capacity, and this power source may be re-charged by a solar cell, a wind installation, or some other ecologically acceptable source. In this case, the security camera may be coupled to a motion detection system, which, upon detection of motion, will enable a first level of learning machine operation. Images captured with an image sensor of the security camera may have very low resolution or other characteristics that permit reduced power operation, and the first level of learning machine operation will produce a binary decision of either "human" or "non-human." In these cases, if the first level of learning machine operation determines that a detected moving object is human, a second level of learning machine operation will be initiated. The second level of learning machine operation, which is expected to consume more power, will provide more complex learning machine analysis such as facial recognition, threat assessment, and other such features. Alternatively, if the first level of learning machine operation determines that the detected moving object is non-human, then the security camera system may remain in a lower power mode of operation. It may be that the detected moving object is an animal, a piece of trash blowing in the wind, a light reflection caused by an object moving outside the security camera field of view, or some other non-human object, however, the first level of learning machine operation will not make this specific identification or determination. Instead, the first level of learning machine operation will only determine that the object is non-human. A conventional security system embodiment having a single level of machine learning could have detected the same motion, identified the non-human object, and determined not to direct any particular action, but this conventional security system will consume more power. Using the teaching herein, an improved security system will consume less power while reaching the same determination not to direct any particular action. By way of this exemplary embodiment, it is shown that the teaching of the present disclosure may be arranged in a very low power system. One non-limiting very low power system is an always-on artificial neural network front-end arranged, upon certain triggers, to invoke operations of a more powerful learning machine. Other such systems are contemplated.

Still considering the improved security camera application, the first level of lower power learning machine is enabled by the teaching of the present disclosure. That is, embodiments of in-memory computing systems that employ integrated bias elements provide learning machine systems with improved accuracy, higher throughput, and lower power.

In at least one embodiment, an in-memory compute array has a first plurality of cells arranged as a plurality of rows of cells intersecting a plurality of columns of cells. Each cell of the first plurality of cells is identifiable by its corresponding row and column. The memory array also includes a plurality of computation engines and a plurality of bias engines. In some embodiments, one or both of the computation engines and bias engines may be physically or operatively integrated with the memory array. In other embodiments, the one or both of the computation engines and bias engines may be separate and distinct from the memory array physically, but communicatively coupled to the memory array so that the components work in cooperation.

Each computation engine may be integrated or otherwise associated with a different one of a second plurality of cells, wherein the second plurality of cells is some or all of the first plurality of cells. Each computation engine may be formed at a respective row and column intersection.

Each bias engine of the plurality of bias engines is arranged to computationally combine an output from one of the plurality of computation engines with a respective bias value. In some cases, the plurality of bias engines may be arranged as an array. In some cases, each respective bias value will be stored in a bias engine that also performs the respective computational combination. One or more bias values may be stored in a repository, which may be a bitcell, a common area of memory, or some other repository. In at least some cases, a plurality of bias engines are arranged in adjacent bitcells.

In some cases, the in-memory compute system of the present disclosure also includes a consolidation circuit. The consolidation circuit may be referred to as a sensing element circuit. In at least some cases, sensing element circuitry associated with any number of bitcells (e.g., an entire bit line (e.g., column) of bitcells) is formed in proximity to one or more computation engines or otherwise associated with one or more computation engines.

The security camera system embodiment having multiple levels of learning machine technology discussed herein is not limiting. That is, the present teaching is not limited to a security system that first detects whether a moving object is human or non-human and then takes action based on the determination. Many other practical applications of the in-memory compute systems, devices, and methods are also considered.

In one practical application of the teaching herein, an oven has been automatically set to cook a particular food item (e.g., pizza, cake, roast, fish, vegetables, or any other food) for a selected amount of time (e.g., 30 minutes, 55 minutes, 240 minutes, or any other selected amount of time). Deploying the inventive concepts discussed in the present disclosure, an image sensor may capture an image at or near the end of the selected cooking time period. If a first level of learning machine determines that the food item is not browned enough, not risen enough, or has not reached some other visual characteristic, then the oven timer can be cooperatively reset to a new selected value. In another practical application, a smart home listening device can deploy a lower power first level of learning machine that only detects whether a person says the phrase, "HEY ALEXA," or not. If the first level of learning machine determines that the phrase of interest has been spoken, then a second level of learning machine that deploys complex natural language processing may be enabled. In a third non-limiting practical application, a coarse learning machine sensor in an vehicle may determine if detected moisture is snow or rain; a coarse learning machine sensor in a vehicle may determine if the weather is sunny or cloudy; a coarse learning machine sensor in an vehicle may determine if a road surface is concrete or asphalt; or a coarse learning machine sensor in a vehicle may determine many other such parameters. Based on the determination by the coarse learning machine sensor, more complex processing in the vehicle may be enabled.

The several practical applications presented herein are illustrative and not limiting. It is recognized that the teaching of the present disclosure may be applied to industrial machines, consumer products, and other devices and systems of all types.

Figure 4:
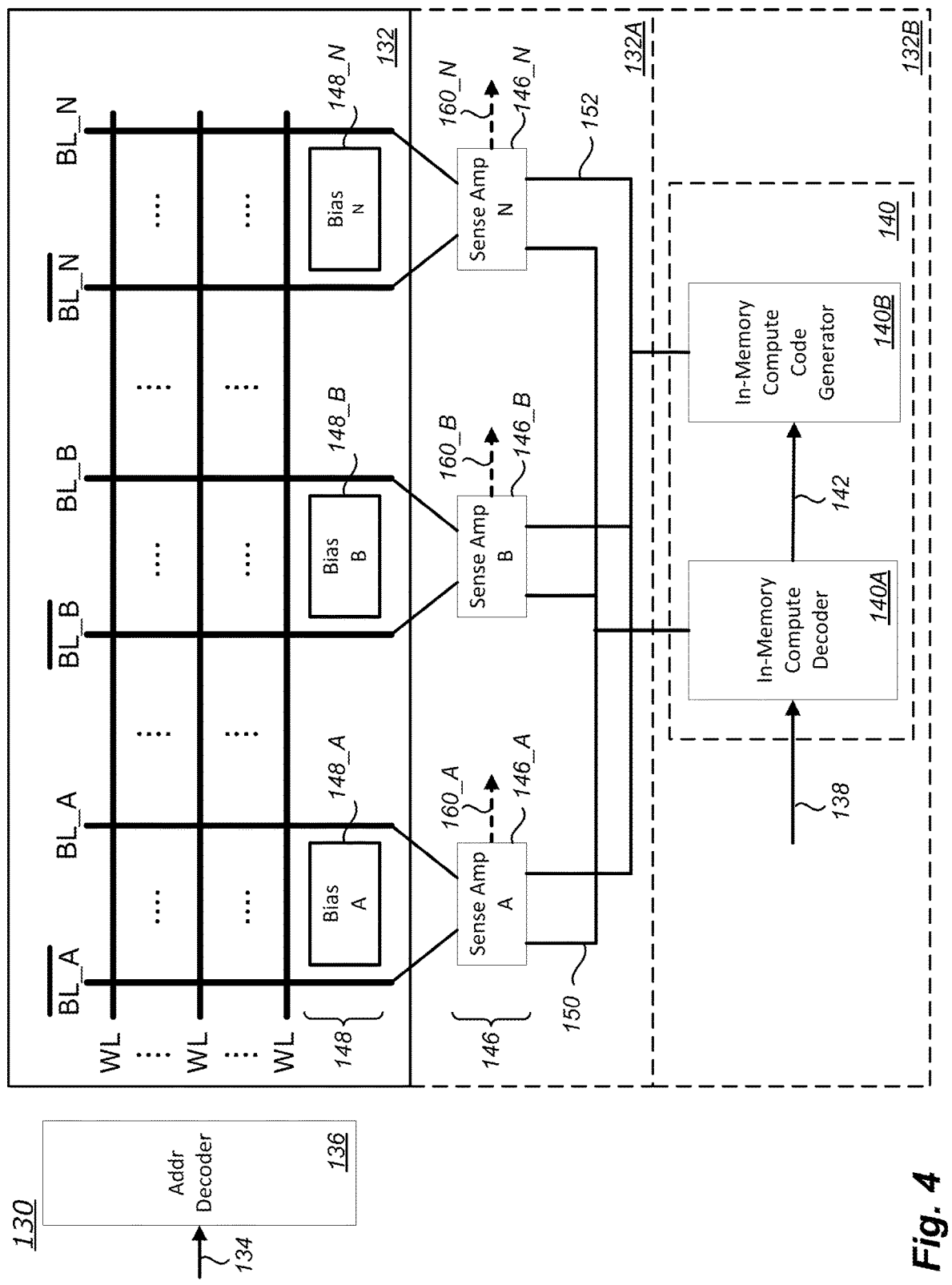
FIG. 4 is an improved in-memory computing system embodiment having integrated bias elements.

FIG. 4 is an improved in-memory computing system 130 having integrated bias elements. The improved in-memory computing system 130 embodiment having integrated bias elements is arranged to perform particular computing operations within a memory array 132. The operations may, for example, include gating operations (e.g., AND, NAND, OR, NOR, XOR, XNOR, and the like), adder and other mathematical functions, shift operations, and the like. The operations will use data stored in the memory array as operands. In at least some cases, information stored in one or more bias circuits 148 is used as operand data in the computing operations.

To utilize the improved in-memory computing system 130 having integrated bias elements, an address 134 is programmatically applied to an address decoder 136. The address 134 may be applied by an applications processor, one of any number of parallel processors, a learning machine function, or some other control mechanism of a computational device.

Address decoder 136 will generate appropriate word line (WL) and bit line (BL) signals along with read and write signals (not shown), which are applied to the memory array 132. The memory array 132, as indicated by a plurality of word lines WL and a plurality of bit lines, BL_A, BL_B, BL_N, may be of any desirable size. In some embodiments, the memory array 132 may optionally include consolidation circuitry (e.g., sensing element circuitry 146), in-memory compute decoder 140A (i.e., decoder circuitry), in-memory compute code generator 140B (i.e., decoder circuitry), and other circuitry arranged to carry out the in-memory computational tasks. Collectively, the in-memory compute decoder 140A, in-memory compute code generator 140B, and other in-memory compute circuits (not shown) may be referred to as in-memory compute logic 140. In some cases, the in-memory compute logic 140 is integrated with the memory array 132 at intersections of some or all rows and columns. In other cases, the in-memory compute logic 140 is arranged in a separate and distinct structure 132B that is proximate to the memory array 132.

In correspondence with address information 134 that is applied to the address decoder 136, one or more in-memory compute instructions 138 are programmatically applied to an in-memory compute decoder 140A. The in-memory compute instructions 138 may be passed from a processor, one of any number of parallel processors, a learning machine function, or some other control mechanism of a computational device. The in-memory compute instructions 138 are in some cases formed as a coded selection of a desired in-memory computation.

The in-memory compute decoder 140A will interpret the in-memory compute instructions 138 and generate appropriate in-memory control signaling 142 that is passed to an in-memory compute code generator 140B. In one exemplary case, the in-memory control signaling 142 is arranged as a multi-line signal, and the plurality of lines are decoded by the in-memory compute code generator 140B into any number of distinct in-memory computational directives, which are passed to respective consolidation circuitry.

The consolidation circuitry in FIG. 4 is illustrated, for brevity, as a set of sensing element circuits 146_A, 146_B, 146_N. It is recognized, however, that the consolidation circuitry may additionally include any one or more of an accumulator, analog-to-digital converter, clock circuit, serial-to-parallel converter, latch, buffer, or the like, alone or together in any suitable cooperative arrangement. In some cases, the consolidation circuitry is arranged to form results values from a programmatic operation directed by a software practitioner. The results values may be data retrieved from memory bitcells; the results values may be the result of an in-memory compute function; the results values may be the result of a computational combination between bias data and data from a memory bitcell or a result of an in-memory compute function; or the results values may be formed in some other way. In some cases, the output of the consolidation circuitry is fed back into the memory array without passing any of the computationally combined values out of the in-memory compute memory device. In some cases, the output of the consolidation circuitry is passed out of the in-memory compute memory device. In still other cases, the output of the consolidation circuitry is both fed back into the memory array and also passed out of the in-memory compute memory device (i.e., the improved in-memory computing system 130 having integrated bias elements).

The sensing element circuits 146_A, 146_B, 146_N of FIG. 4 may collectively be referred to herein as sensing element circuits 146. The sensing element circuits 146 read information (e.g., differentially, non-differentially, or in some other way) from bit lines in a known way that is not further described. Information that is generated by the sensing element circuits 146_A, 146_B, 146_N may be output from the memory array 132 via conduits 160_A, 160_B, 160_N, respectively. In addition, or in the alternative, the information generated by the sensing element circuits 146_A, 146_B, 146_N may be stored in an originating cell of the memory array 132 or stored in one or more different cells of the memory array 132.

The in-memory compute decoder 140A and the in-memory compute code generator 140B of FIG. 4 respectively pass in-memory compute selection signals 150 and in-memory compute directive signals 152 to the sensing element circuits 146. The in-memory compute selection signals 150 may be arranged to direct sensing element circuits 146 to the appropriate circuitry that will perform the selected computation. In at least some cases, the in-memory compute directive signals 152 may control the in-memory computation and further direct the sensing element circuits 146 to apply signaling to the bit lines to store the computational results back into the memory array 132. In some cases, the sensing element circuits 146 are integrated with the memory array 132 at ends of each column of bit lines. In other cases, the sensing element circuits 146 are arranged in a separate and distinct structure 132A that is proximate to the memory array 132.

Figure 2:
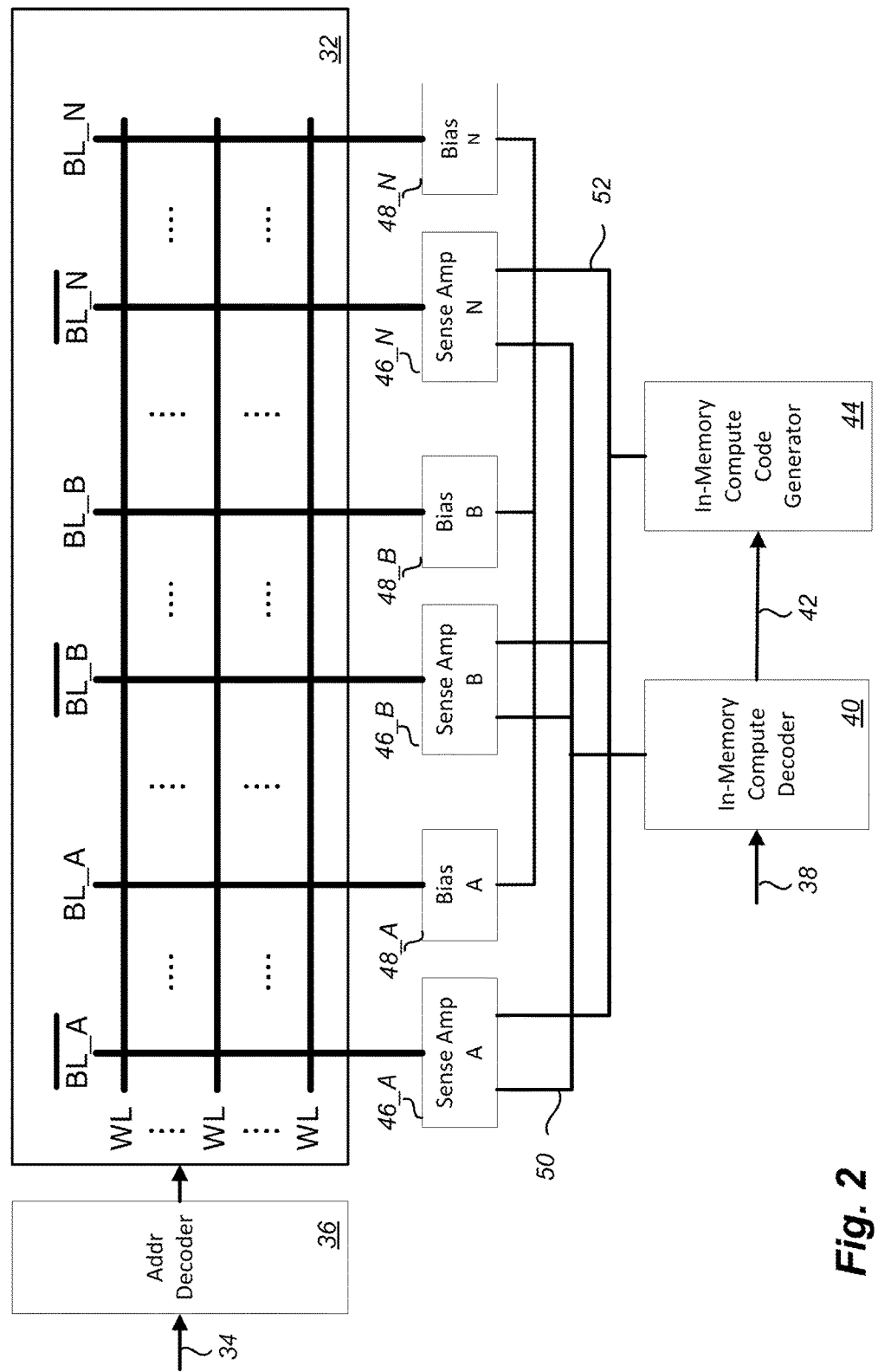
FIG. 2 is a conventional in-memory computing system.
Figure 3:
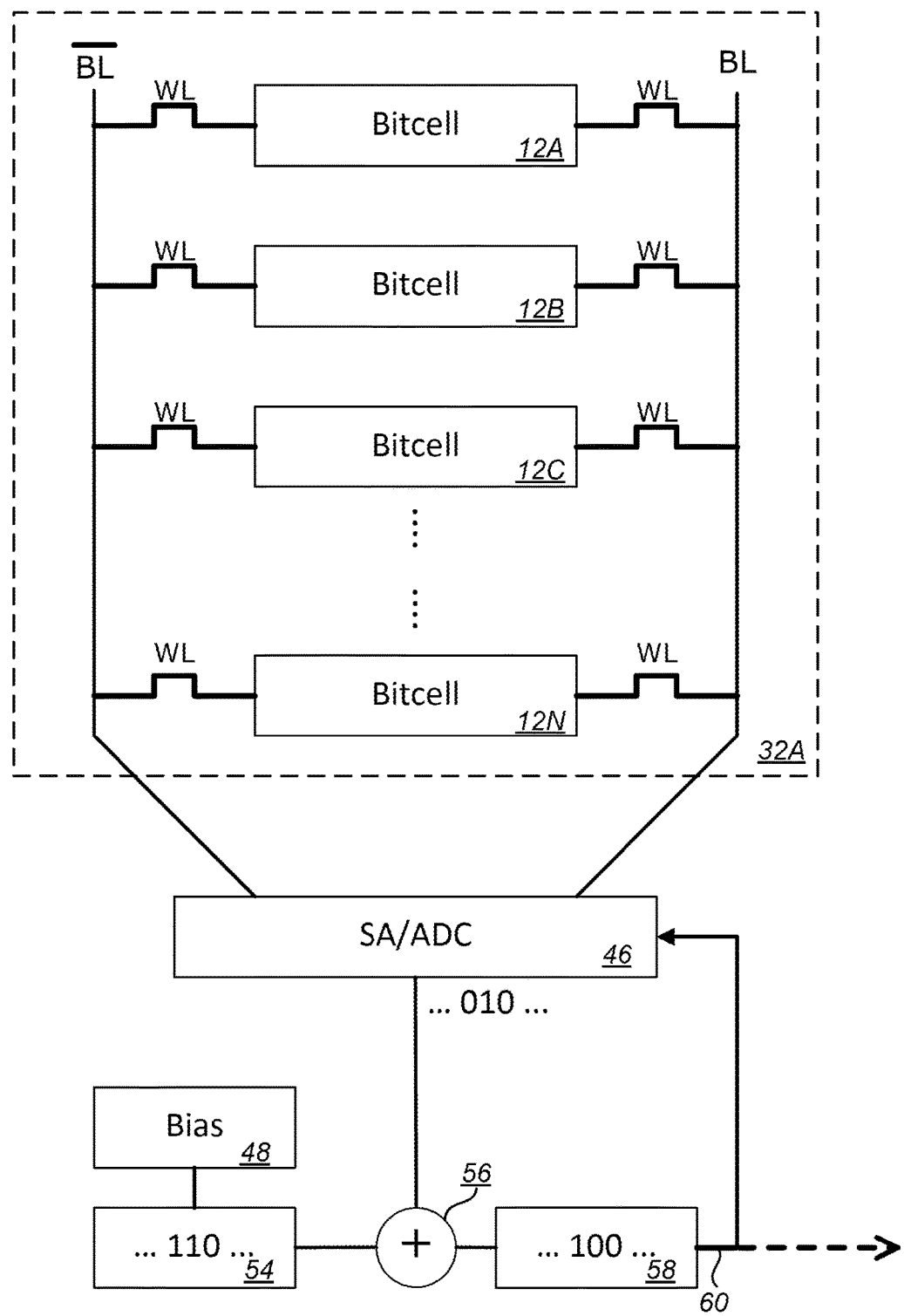
FIG. 3 is a portion of the conventional in-memory computing system of FIG. 2 in more detail.

A set of bias circuits 148_A, 148_B, 148_N may collectively be referred to herein as bias circuits 148, bitcells 148, bias control circuitry 148, bias engines 148, or another like term. The bias circuits 148 are integrated within the memory array 132. In some cases, the bias circuits 148 include bitcells that store bias values. The bias circuits 148 are also coupled to the bit lines of the memory array 132. In at least some cases, the bias circuits 148 are arranged to apply a suitable bias voltage before, during, or after any number of in-memory computations. Application of such voltage or other suitable value can improve accuracy of the learning machine results. Different from the conventional in-memory computing system 30 (FIG. 2), which can only apply a bias voltage after an entire in-memory computation across all of the cells in a column has been performed, the bias values as described herein may in various embodiments be applied before, during, and after a computation.

In at least one practical application, the improved in-memory computing system 130 having integrated bias elements is deployed in a convolutional neural network (CNN) that performs image processing (e.g., image classification, image localization and classification, pixel level semantic segmentation, or other image processing). A plurality of memory bitcells in the memory array 132 is used in one or more layers of the CNN to store kernel data, feature data, or other types of data. In one or more layers, the software practitioner has determined that applying bias values before a final decision of the layer is rendered will provide benefits. For example, if an image is "dim," a bias value may be added to brighten the image. If an image is very bright, a bias value may be applied to add contrast. Considering one implementation of such a case, image data is streamed into the memory array 132 across a plurality of word lines, and a particular operation is performed. That is, in at least one embodiment, any number of one or more in-memory functions are performed wherein at least some of the in-memory functions of the plurality of in-memory functions take ones of the plurality of neural network values (e.g., kernel values, feature values, or other values) as operands. Results of the plurality of in-memory functions are stored in a respective second plurality of cells, wherein the second plurality of cells is formed from cells of the memory array 132. At this stage, the present teaching permits bias to be computationally combined or otherwise applied very flexibly. For example, bias may be applied to each of the plurality of word lines, to a portion of the plurality of word lines, to one or a plurality of columns, to one or more portions of one or more word lines, or any other suitable arrangement. In at least one embodiment, computationally combining the results of the plurality of in-memory functions with a respective plurality of bias values includes combining a row of results information with a row of bias values.

In the embodiment of FIG. 4, bias information, via bias circuits 148, can be stored and distributed in a plurality of rows and columns associated with a complete computation. Bias storage rows, for example, can have thermometric or digital coding to enable a wide range of bias value application. The bias data, via bias circuits 148, is applied alongside analog computation leading to improved accuracy, lower power consumption, and higher throughput.

Figure 5:
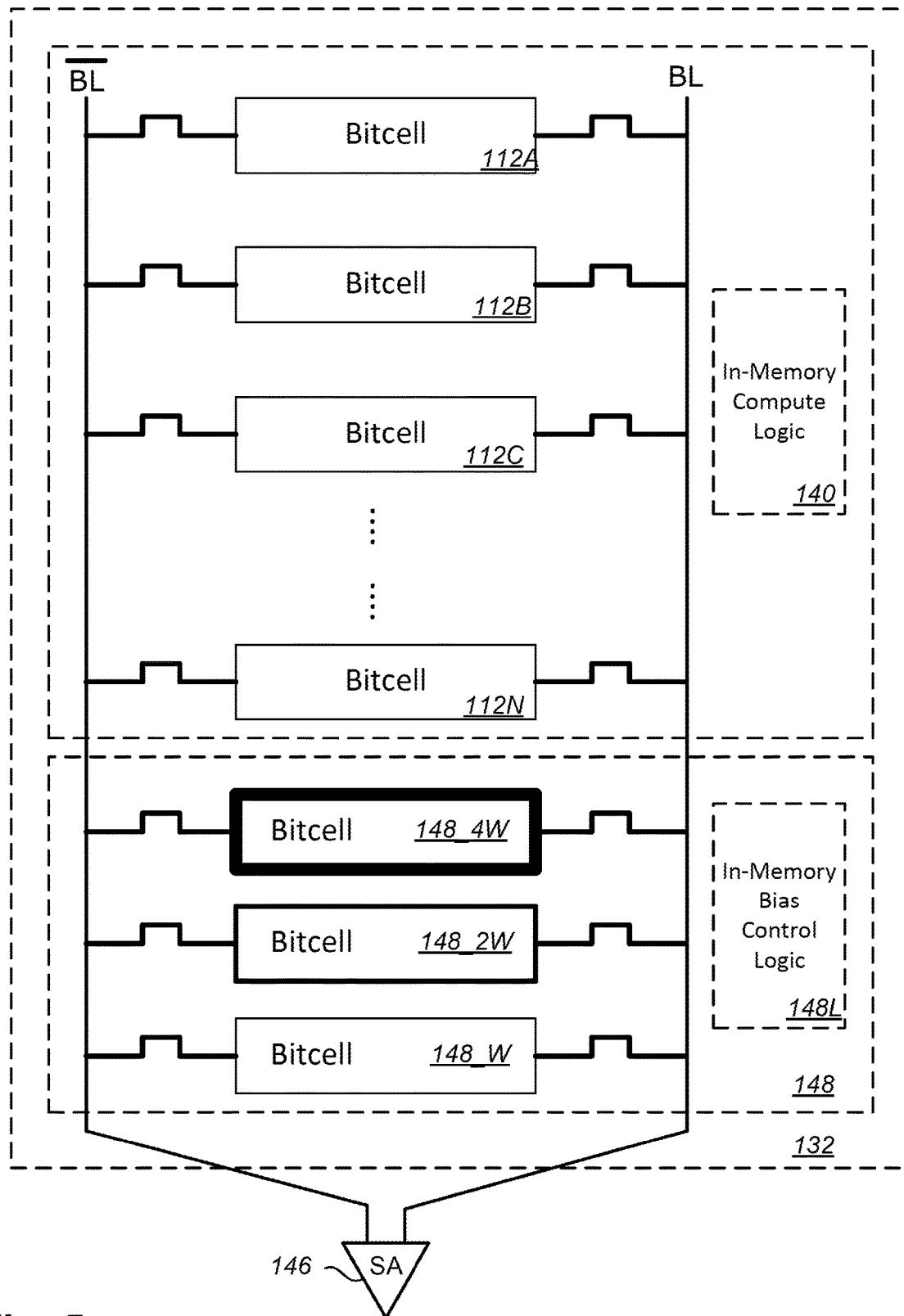
FIG. 5 is a portion of the improved in-memory computing system embodiment having integrated bias elements of FIG. 4 in more detail.

FIG. 5 is a portion 130A of the improved in-memory computing system 130 having integrated bias elements of FIG. 4 in more detail. In the portion 130A, an entire column of bitcells 112A-112N is represented between a pair of differential bit lines in memory array 132. Each bit cell 112A-112N may be along the lines of bitcell 12 in FIG. 1 (e.g., each bitcell may be a memory bitcell). The entire line (e.g., column) may include 8 bitcells, 128 bit cells, 1024 bitcells, 8192 bitcells, or some other number of bitcells. The in-memory compute functions of FIG. 5 are not repeated for brevity. To avoid obfuscating the figure, access transistors are represented in FIG. 5 but not individually labelled. The bitcells of FIG. 5 may be arranged as an array (e.g., a compute array) having a first plurality of cells. The compute array may be arranged as a plurality of rows of cells intersecting a plurality of columns of cells, wherein each cell of the first plurality of cells is identifiable by its corresponding row and column. In some cases, the compute array of bitcells is formed as a static random access memory (SRAM) memory array.

Integrated with the memory array 132 is a plurality of extra rows of bias bitcells 148_4W, 148_2W, 148_W optionally formed with or within a set of bias circuits 148 in or otherwise cooperative with the memory array 132. In the embodiment of FIG. 5, bias bitcells 148_4W, 148_2W, 148_W are dedicated to storing bias information that will be computationally combined (e.g., mathematically, logically, combinatorially, electrically, or combined in some other like manner) or otherwise applied to partial and complete values generated by the in-memory compute functions. In some cases, each bias bitcell 148_4W, 148_2W, 148_W is formed along the lines of a bitcell 12 of FIG. 1. In these cases, any of the bias bitcells 148_4W, 148_2W, 148_W are arranged to store individual bit values (e.g., logic one (i.e., "1") or logic zero (i.e., "0")), and the values of any number of bias bitcells 148_4W, 148_2W, 148_W may be grouped together to select a suitable bias value.

Alternatively, or in addition, in other cases, bias bitcells 148_4W, 148_2W, 148_W are arranged having MOSFETs (e.g., T3, T4, T5, T6 of FIG. 1) formed with different structural characteristics. For example, the MOSFETs of any number of bias bitcells or other circuits in the bias circuits 148 may be arranged having selected channel lengths and widths, and such different characteristics may represent different resistance values, current limits, voltage drops, or the like. Accordingly, in at least some cases, one or more bitcells are arranged as memory bitcells along the lines of the memory bitcell of FIG. 1.

In FIG. 5, a first bias bitcell 148_4W is represented with bolder lines to indicate a channel width 4W that is four times the width of MOSFETs of other bias bitcells 148. Along these lines, a second bias bitcell 148_2W indicates a channel width 2W that is two times the width of MOSFETs of other bias bitcells in the bias circuits 148. And a third bias bitcell 148_W indicates a channel width that is the same size as MOSFETs of other bias bitcells of the bias circuits 148. By changing the physical characteristics of various bias bitcells, the level of bias that is applied to any partial or complete computation may be finely controlled.

The bias circuits 148 may in some cases include separate and distinct in-memory bias control logic 148L. The in-memory bias control logic 148L may be arranged to select bias bitcell information to be applied to memory bitcell data, computational bitcell data, or memory bitcell data and computational bitcell data. For example, a software practitioner may programmatically select bias information from a first plurality of bias bitcells 148_4W, 148_2W, 148_W to be applied to one or more compute logic functions of the in-memory compute logic 140. In this way, for each in-memory functional computation performed using the data at the selected bitcells, the desired bias values will also be applied.

Optionally, as represented in FIG. 5, the in-memory compute logic 140 may at least in some cases be integrated completely or partially within the memory array 132. This in-memory compute logic 140 may arrange the computation function logic at intersections of some or all rows and columns. The in-memory compute logic may be referred to herein as one or more computation engines.

In operation, data from the column of bitcells 112A-112N and data from the bias bitcells in bias circuits 148 is collected by sensing element circuitry 146. The sensing element circuitry is not further described, but one of skill in the art will recognize how such data may be further processed such as by digitizing the collected and determined data. The determined data may be communicated from the memory array 132 via output conduits 160_A, 160_B, 160_N (FIG. 4), stored in the memory array 132, or processed in some other way.

FIG. 6 is a memory array 132 (i.e., a compute memory array) embodiment that illustrates in-memory computing functions and a plurality of bias elements. To avoid obscuring the inventive concepts disclosed in FIG. 6, individual bitcells are not illustrated in the memory array 132 of FIG. 6. Nevertheless, it is understood by one of skill in the art that such memory repositories of any particular architecture will be included.

The memory array 132 of FIG. 6 is organized as a plurality of cells arranged as a plurality of rows of cells intersecting a plurality of columns of cells. One or more cells may be formed at each intersection of a row and column. Though not labelled to simplify the illustration, each cell in the memory array 132 is identifiable by its corresponding row and column. As evident in the memory array, each cell of a first plurality of cells has an associated in-memory function (i.e., a computation engine), and each cell of a second plurality of cells has an associated bias element (i.e., a bias engine). One or both of the computation engines and the bias engines may be arranged as an array, and such arrays, in at least some cases, are addressable via a selected row and column address. For example, at column 170, row 180, a first in-memory computing function F1[a1] is represented. If the bitcell corresponding to this function is invoked, and if the software practitioner has encoded the in-memory compute logic 140, then the in-memory computing function F1[a1] will be performed. Along these lines, a second function F1[b1] is encoded at column 172, row 180, and any number of other functions are encoded across row 180 and ending with function F1[ . . . 1] at column 174. A second set of in-memory computing functions F2 are further integrated in the memory array 132 at column 176 to column 178, row 180, and further in-memory computing functions may be integrated in each cell between column 170, row 182 and column 178, row 182, ending with a final in-memory computing function Fx[ . . . n]. It is recognized that the functions illustrated in FIG. 6 may cover a single bit, a sequence of bits, a group of bits, or any suitable plurality of bits. In at least some embodiments, at least one in-memory computing function (i.e., a computing engine) is formed at each of a plurality of row and column intersections. In these or alternate embodiments, any number of in-memory computing functions (i.e., a computing engine) are formed in proximity to selected row and column intersections or formed at some but not all row and column intersections. In this way, in some embodiments, memory bitcells may be formed at a first plurality of cells of the in-memory compute device and in-memory computing functions are formed at a second plurality of cells of the in-memory compute device.

One or more in-memory computing functions may be arranged at each cell. That is, in some cases, some addressable memory cells, which are identifiable via a row and column, will be arranged with a first type of in-memory computing function, and other addressable memory cells will be arranged with a second different type of in-memory computing function. Any other number of memory cells will be enabled with any number of other different in-memory computing functions. In addition, or in the alternative, a plurality of memory cells may each be enabled with a configurable set of in-memory computing function circuits such that each provided memory cell will have a programmatically selectable in-memory computing function. In some cases, one or more memory cells may be directed to perform a plurality of in-memory computing functions.

Along the flexible organization of in-memory computing functions, one or more bias elements may be arranged at each cell, at adjacent cells, at alternate cells, or in any other suitable arrangement. That is, in some cases, some addressable memory cells, which are identifiable via a row and column, will be arranged with a first type of bias element, and other addressable memory cells will be arranged with a second different type of bias element. In FIG. 6, a first row of bias elements 184 and a last row of bias elements 186 are identified. Any suitable number of rows may be formed. Any other numbers of memory cells will be enabled with any number of other different bias elements. In addition, or in the alternative, a plurality of memory cells may each be enabled with a configurable set of bias elements such that each provided memory cell will have a programmatically selectable bias element. In some cases, one or more memory cells may be directed to include a plurality of bias element values. For example, in some cases, a partial or full row of memory cells may be directed to include the bias information from a selected bias element. In other cases, a partial or full column of memory cells may be directed to include the bias information from a selected bias element. When in operation, the software practitioner will direct operations that cause any number of selected bias element values to be computationally combined (e.g., mathematically, logically, combinatorially, electrically, or combined in some other like manner) with data in a memory bitcell, a result of an in-memory computation, or some other data.

The integers, function identifiers, and row and column designators that are identified in FIG. 6 and described herein are not limiting and instead are suitably selected to match the desired organization of memory array 132. Many other desirable organizations are contemplated. In some cases, every cell at the intersection of every row and every column may have one or both of an in-memory computing function and a bias element, as the case may be. In other embodiments, fewer than all cells are arranged with in-memory computing functions or bias elements.

Figure 7:
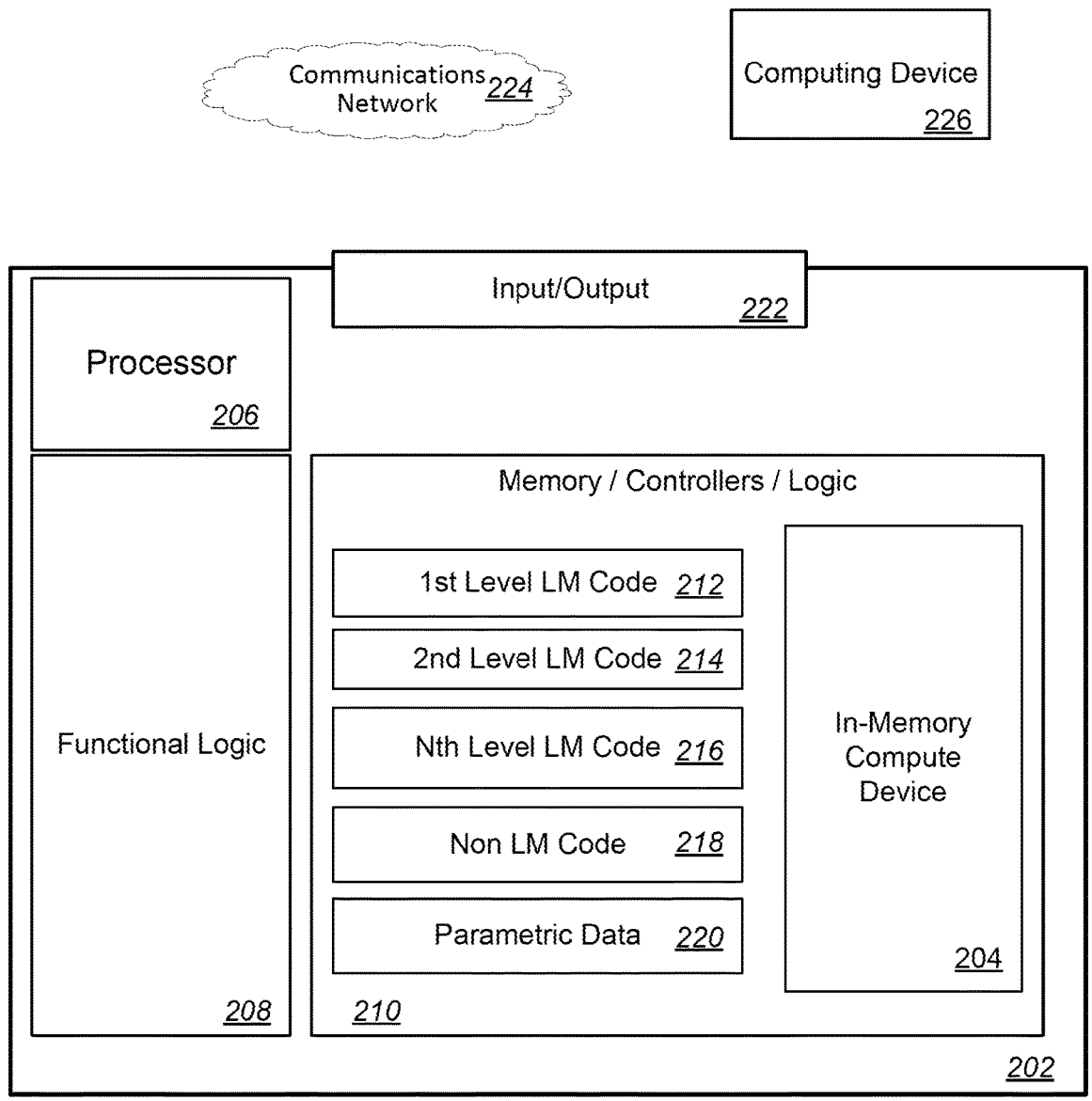
FIG. 7 is a system embodiment that includes an apparatus having an in-memory compute device.

FIG. 7 is a system embodiment 200 that includes an apparatus 202 having an in-memory compute device 204. The in-memory compute device 204 may be along the lines of the improved in-memory computing system 130 having integrated bias elements of FIG. 4. The in-memory compute device 204 may also be referred to herein as an in-memory compute memory device, an IMC memory device, an IMC device, or some other like term. The apparatus 202 may be any suitable apparatus. For example, the apparatus 202 may be an industrial machine, a consumer product, or some other device or system of any suitable form factor and function. For example, the apparatus 202 may be a security system, an oven sensor, an automobile or some other form of transportation vehicle, a mobile computing device (e.g., smartphone, wearable device, tablet, or the like), an Internet of Things (IoT) device such as a remotely deployed sensor (e.g., ecological sensor, farming conditions sensor, weather sensor, power grid infrastructure sensor, smart home device, or the like), and the like. It is recognized that this list of apparatuses is not limiting, and the inventors have contemplated other types of apparatuses, which are not listed for brevity.

The apparatus 202 includes a processor 206, functional logic 208, and one or more memory devices 210. The in-memory compute device 204 is one of the memory devices included in the one or more memory devices 210, and the one or more memory devices 210 may include zero or more other memory devices. When the one or more memory devices 210 include at least two memory devices, the memory devices may or may not share power control circuitry, communications bus circuitry, control parameter circuitry, and other circuitry.

In the embodiment of FIG. 7, the one or more memory devices 210 are arranged to store program code and data. Some or all of the program code or data may be stored in the in-memory compute device 204. Some or all of the program code or data may be stored in some other memory device. The processor 206 may, when it is operating, retrieve and execute any number of instructions of the program code stored in the one or more memory devices 210.

The program code stored in the one or more memory devices 210 of the non-limiting embodiment of FIG. 7 includes several levels of learning machine code such as a first level of learning machine code 212, a second level of learning machine code 214, and one or more additional levels of learning machine code which are identified as an Nth level of learning machine code 216. The one or more memory devices 210 may further store non-learning machine code 218, parametric data 220, and any other information selected by one or more software practitioners.

In at least some cases, the parametric data includes kernel or feature data for a convolutional neural network, control data to direct the performance of in-memory computing functions, control data to direct the application of bias value information, and other such data as taught in the present disclosure.

The system embodiment of FIG. 7 may include input/output (I/O) logic 222. The I/O logic 222 may cooperate with the functional logic 208. In some embodiments, the functional logic includes any number and type of sensors (e.g., accelerometers, motion detectors, image sensors, audio sensors, visual output devices, audio output devices, tactile output devices, and the like). In some cases, the I/O logic 222 includes one or more transceivers, one or more human interface devices (e.g., displays or other presentation devices, keyboards, touch screen devices, mice, and the like). In at least some cases, the I/O logic 222 includes a transceiver that communicates via a communications network 224 with some other remote computing device. The remote computing device may provide, for example, image data that is processed by the apparatus 202. In these and other cases, the communications network 224 may be a wide area network (e.g., the Internet), a local area network (LAN), a personal area network (PAN), or some other network. It is recognized that the functional logic 208 and the I/O logic 222 may individually or cooperatively generate or otherwise provide streaming data to the in-memory compute device 204.

Having now set forth certain embodiments, further clarification of certain terms used herein may be helpful to providing a more complete understanding of that which is considered inventive in the present disclosure.

In the embodiments of present disclosure, various components, circuits, modules, devices, and other such structures of the embodiments are interchangeably described herein as "coupled," "connected," "attached," and the like. It is recognized such terms may include intervening structures.

The figures in the present disclosure illustrate portions of one or more non-limiting computing device embodiments. The computing devices may include operative hardware found in conventional computing device apparatuses such as one or more processors, volatile and non-volatile memory, serial and parallel input/output (I/O) circuitry compliant with various standards and protocols, wired and/or wireless networking circuitry (e.g., a communications transceiver), one or more user interface (UI) modules, logic, and other electronic circuitry.

Processing devices, or "processors," as described herein, include central processing units (CPU's), microcontrollers (MCU), digital signal processors (DSP), application specific integrated circuits (ASIC), peripheral interface controllers (PIC), state machines, and the like. Accordingly, a processor as described herein includes any device, system, or part thereof that controls at least one operation, and such a device may be implemented in hardware, firmware, or software, or some combination of at least two of the same. The functionality associated with any particular processor may be centralized or distributed, whether locally or remotely. Processors may interchangeably refer to any type of electronic control circuitry configured to execute programmed software instructions. The programmed instructions may be high-level software instructions, compiled software instructions, assembly-language software instructions, object code, binary code, micro-code, or the like. The programmed instructions may reside in internal or external memory or may be hard-coded as a state machine or set of control signals. According to methods and devices referenced herein, one or more embodiments describe software executable by the processor, which when executed, carries out one or more of the method acts.

As known by one skilled in the art, a computing device has one or more memories, and each memory comprises any combination of volatile and non-volatile computer-readable media for reading and writing. Volatile computer-readable media includes, for example, random access memory (RAM). Non-volatile computer-readable media includes, for example, read only memory (ROM), magnetic media such as a hard-disk, an optical disk, a flash memory device, a CD-ROM, and/or the like. In some cases, a particular memory is separated virtually or physically into separate areas, such as a first memory, a second memory, a third memory, etc. In these cases, it is understood that the different divisions of memory may be in different devices or embodied in a single memory. The memory in some cases is a non-transitory computer medium configured to store software instructions arranged to be executed by a processor. Some or all of the stored contents of a memory may include software instructions executable by a processing device to carry out one or more particular acts.

The computing devices illustrated herein may further include operative software found in a conventional computing device such as an operating system or task loop, software drivers to direct operations through I/O circuitry, networking circuitry, and other peripheral component circuitry. In addition, the computing devices may include operative application software such as network software for communicating with other computing devices, database software for building and maintaining databases, and task management software where appropriate for distributing the communication and/or operational workload amongst various processors. In some cases, the computing device is a single hardware machine having at least some of the hardware and software listed herein, and in other cases, the computing device is a networked collection of hardware and software machines working together in a server farm to execute the functions of one or more embodiments described herein. Some aspects of the conventional hardware and software of the computing device are not shown in the figures for simplicity.

Amongst other things, the exemplary computing devices of the present disclosure that include the in-memory compute devices taught herein may be configured in any type of mobile or stationary computing device such as a remote cloud computer, a computing server, a smartphone, a tablet, a laptop computer, a wearable device (e.g., eyeglasses, jacket, shirt, pants, socks, shoes, other clothing, hat, helmet, other headwear, wristwatch, bracelet, pendant, other jewelry), vehicle-mounted device (e.g., train, plane, helicopter, unmanned aerial vehicle, unmanned underwater vehicle, unmanned land-based vehicle, automobile, motorcycle, bicycle, scooter, hover-board, other personal or commercial transportation device), industrial device (e.g., factory robotic device, home-use robotic device, retail robotic device, office-environment robotic device), or the like. Accordingly, the computing devices include other components and circuitry that is not illustrated, such as, for example, a display, a network interface, memory, one or more central processors, camera interfaces, audio interfaces, and other input/output interfaces. In some cases, the exemplary computing devices may also be configured in a different type of low-power device such as a mounted video camera, an Internet-of-Things (IoT) device, a multimedia device, a motion detection device, an intruder detection device, a security device, a crowd monitoring device, or some other device. These devices generally include computing functions and network functions, wherein the network functions are arranged to permit the computing device of interest to communicate with other computing devices via a wide area communications network such as the Internet.

When so arranged as described herein, each computing device may be transformed from a generic and unspecific computing device to a combination device arranged comprising hardware and software configured for a specific and particular purpose such as to provide a determined technical solution. When so arranged as described herein, to the extent that any of the inventive concepts described herein are found by a body of competent adjudication to be subsumed in an abstract idea, the ordered combination of elements and limitations are expressly presented to provide a requisite inventive concept by transforming the abstract idea into a tangible and concrete practical application of that abstract idea.

The embodiments described herein use computerized technology to improve the technology of learning machines, but other techniques and tools remain available to implement bias in such learning machines. Therefore, the claimed subject matter does not foreclose the whole or even substantial learning machine technological area. The innovation described herein uses both new and known building blocks combined in new and useful ways along with other structures and limitations to create something more than has heretofore been conventionally known. The embodiments improve on computing systems which, when un-programmed or differently programmed, cannot perform or provide the specific learning machine, in-memory computing system features claimed herein. The embodiments described in the present disclosure improve upon known bias management processes and techniques. The computerized acts described in the embodiments herein are not purely conventional and are not well understood. Instead, the acts are new to the industry. Furthermore, the combination of acts as described in conjunction with the present embodiments provides new information, motivation, and business results that are not already present when the acts are considered separately. There is no prevailing, accepted definition for what constitutes an abstract idea. To the extent the concepts discussed in the present disclosure may be considered abstract, the claims present significantly more tangible, practical, and concrete applications of said allegedly abstract concepts. Said claims also improve previously known computer-based systems that perform bias management operations.

Software may include a fully executable software program, a simple configuration data file, a link to additional directions, or any combination of known software types. When a computing device updates software, the update may be small or large. For example, in some cases, a computing device downloads a small configuration data file to as part of software, and in other cases, a computing device completely replaces most or all of the present software on itself or another computing device with a fresh version. In some cases, software, data, or software and data is encrypted, encoded, and/or otherwise compressed for reasons that include security, privacy, data transfer speed, data cost, or the like.

Input/output (I/O) circuitry and user interface (UI) modules include serial ports, parallel ports, universal serial bus (USB) ports, IEEE 802.11 transceivers and other transceivers compliant with protocols administered by one or more standard-setting bodies, displays, projectors, printers, keyboards, computer mice, microphones, micro-electro-mechanical (MEMS) devices such as accelerometers, and the like.

In at least one embodiment, devices such as the learning machines described herein may communicate with other devices via communication over a network. The network may involve an Internet connection or some other type of local area network (LAN) or wide area network (WAN). Non-limiting examples of structures that enable or form parts of a network include, but are not limited to, an Ethernet, twisted pair Ethernet, digital subscriber loop (DSL) devices, wireless LAN, Wi-Fi, Worldwide Interoperability for Microwave Access (WiMax), or the like.

In the present disclosure, memory may be used in one configuration or another. The memory may be configured to store data. In the alternative or in addition, the memory may be arranged as a non-transitory computer readable medium (CRM). The CRM is configured to store computing instructions executable by a processor of the learning machines described herein. The computing instructions may be stored individually or as groups of instructions in files. The files may include functions, services, libraries, and the like. The files may include one or more computer programs or may be part of a larger computer program. Alternatively or in addition, each file may include data or other computational support material useful to carry out the computing functions of a learning machine.

As described herein, for simplicity, a software practitioner may in some cases be described in the context of the male gender. It is understood that a software practitioner can be of any gender, and the terms "he," "his," and the like as used herein are to be interpreted broadly inclusive of all known gender definitions. As the context may require in this disclosure, except as the context may dictate otherwise, the singular shall mean the plural and vice versa; all pronouns shall mean and include the person, entity, firm or corporation to which they relate; and the masculine shall mean the feminine and vice versa.

Unless defined otherwise, the technical and scientific terms used herein have the same meaning as commonly understood by one of ordinary skill in the art to which this invention belongs. Although any methods and materials similar or equivalent to those described herein can also be used in the practice or testing of the present invention, a limited number of the exemplary methods and materials are described herein.

The terms "include" and "comprise" as well as derivatives and variations thereof, in all of their syntactic contexts, are to be construed without limitation in an open, inclusive sense, (e.g., "including, but not limited to"). The term "or," is inclusive, meaning and/or. The phrases "associated with" and "associated therewith," as well as derivatives thereof, can be understood as meaning to include, be included within, interconnect with, contain, be contained within, connect to or with, couple to or with, be communicable with, cooperate with, interleave, juxtapose, be proximate to, be bound to or with, have, have a property of, or the like.

Reference throughout this specification to "one embodiment" or "an embodiment" and variations thereof means that a particular feature, structure, or characteristic described in connection with the embodiment is included in at least one embodiment. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content and context clearly dictates otherwise. It should also be noted that the conjunctive terms, "and" and "or" are generally employed in the broadest sense to include "and/or" unless the content and context clearly dictates inclusivity or exclusivity as the case may be. In addition, the composition of "and" and "or" when recited herein as "and/or" is intended to encompass an embodiment that includes all of the associated items or ideas and one or more other alternative embodiments that include fewer than all of the associated items or ideas.

In the present disclosure, conjunctive lists make use of a comma, which may be known as an Oxford comma, a Harvard comma, a serial comma, or another like term. Such lists are intended to connect words, clauses or sentences such that the thing following the comma is also included in the list.

The headings and Abstract of the Disclosure provided herein are for convenience only and do not interpret the scope or meaning of the embodiments.

The various embodiments described above can be combined to provide further embodiments. Various features of the embodiments are optional, and features of one embodiment may be suitably combined with other embodiments. Aspects of the embodiments can be modified, if necessary to employ concepts of the various patents, application and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A system, comprising:
   processing circuitry; and
   a memory coupled to the processing circuitry, the memory including an in-memory-compute (IMC) device having:
      a first plurality of cells arranged as a plurality of rows of cells intersecting a plurality of columns of cells;
      a plurality of computation engines, each computation engine respectively formed in a different one of a second plurality of cells, the second plurality of cells being formed from cells of the first plurality of cells, each computation engine formed at a respective row and column intersection; and
      a plurality of bias engines, which, in operation, computationally combine outputs of the plurality of computation engines with respective bias values.

2. The system of claim 1 wherein a portion of the first plurality of cells comprises an array of memory bitcells.

3. The system of claim 2 wherein the array of memory bitcells is a static random access memory (SRAM) memory array.

4. The system of claim 1 wherein at least one of the plurality of computation engines, in operation, performs a gating operation.

5. The system of claim 1 wherein at least one of the plurality of computation engines, in operation, performs a mathematical operation.

6. The system of claim 1, comprising one or more sensors coupled to the processing circuitry.

7. The system of claim 1 wherein the processing circuitry comprises one or more functional logic circuits.

8. The system of claim 1, comprising a second memory coupled to the processing circuitry, wherein the second memory, in operation, stores instructions executable by the processing circuitry.

9. The system of claim 8, wherein the processing circuitry, in operation, executes the stored instructions and the stored instructions comprise learning machine code.

10. An in-memory compute (IMC) method, comprising:
storing a plurality of values in respective memory bitcells of an in-memory compute memory device, wherein the in-memory compute memory device has a first plurality of cells arranged as a plurality of rows of cells intersecting a plurality of columns of cells, each cell of the first plurality of cells identifiable by its corresponding row and column;
performing a plurality of in-memory compute operations, each of the in-memory compute operations using one or more of the stored plurality of values as an operand;
storing results of the plurality of in-memory compute operations in a second plurality of cells, the second plurality of cells being formed from cells of the first plurality of cells; and
computationally combining results of the plurality of in-memory compute operations with respective bias values.

11. The IMC method of claim 10 wherein a portion of the in-memory compute memory device is a static random access memory (SRAM) memory device.

12. The IMC method of claim 10 wherein the plurality of in-memory compute operations include at least one gating function and at least one mathematical function.

13. The IMC method of claim 10 wherein computationally combining results of the plurality of in-memory compute operations with respective bias values includes:
combining a row of results information with a row of bias values.

14. The IMC method of claim 10 wherein computationally combining results of the plurality of in-memory compute operations with respective bias values includes:
producing a set of computationally combined values; and
storing the set of computationally combined values in memory bitcells of the first plurality of cells without passing the set of computationally combined values out of the in-memory compute memory device.

15. The IMC method of claim 10 wherein computationally combining results of the plurality of in-memory functions with respective bias values includes:
producing a set of computationally combined values;
storing the set of computationally combined values in memory bitcells of the first plurality of cells; and
passing at least some of the set of computationally combined values out of the in-memory compute memory device.

16. An in-memory compute (IMC) device, comprising:
a compute array having a first plurality of cells, the compute array arranged as a plurality of rows of cells intersecting a plurality of columns of cells, each cell of the first plurality of cells identifiable by its corresponding row and column, wherein, in operation, the first plurality of cells store a plurality of values;
a plurality of computation engines, each computation engine respectively formed in a different one of a second plurality of cells, the second plurality of cells being formed from cells of the first plurality of cells, each computation engine formed at a respective row and column intersection, wherein in operation, the second plurality of cells perform a plurality of in-memory compute operations, each of the in-memory compute operations using one or more of the stored plurality of values as an operand; and
a plurality of bias engines, which, in operation, computationally combine outputs of the plurality of computation engines with respective bias values.

17. The IMC device of claim 16 wherein the plurality of in-memory compute operations include at least one gating function and at least one mathematical function.

18. The IMC device of claim 16 wherein computationally combining outputs of the plurality of computation engines with respective bias values includes:
combining a row of results information with a row of bias values.

19. The IMC device of claim 16 wherein computationally combining computationally combining outputs of the plurality of computation engines with respective bias values includes:
producing a set of computationally combined values; and
storing the set of computationally combined values in memory bitcells of the first plurality of cells.

20. The IMC device of claim 19 wherein computationally combining outputs of the plurality of computation engines with respective bias values includes:
passing at least some of the set of computationally combined values out of the in-memory compute memory device.

* * * * *

UNITED STATES PATENT AND TRADEMARK OFFICE
CERTIFICATE OF CORRECTION

PATENT NO. : 11,605,424 B2
APPLICATION NO. : 17/375945
DATED : March 14, 2023
INVENTOR(S) : Anuj Grover et al.

Page 1 of 1

It is certified that error appears in the above-identified patent and that said Letters Patent is hereby corrected as shown below:

In the Claims

<u>In Column 22, Claim 19, Lines 35-36:</u>
"wherein computationally combining computationally combining outputs"
Should read:
-- wherein computationally combining outputs --.

Signed and Sealed this
Second Day of May, 2023

Katherine Kelly Vidal
*Director of the United States Patent and Trademark Office*